US007545237B2

(12) United States Patent
Hagelin et al.

(10) Patent No.: US 7,545,237 B2
(45) Date of Patent: Jun. 9, 2009

(54) SERRATED MEMS RESONATORS

(75) Inventors: Paul Merritt Hagelin, Saratoga, CA (US); David Raymond Pedersen, Mountain View, CA (US)

(73) Assignee: SiTime Inc., Sunnyvale, CA (US)

( * ) Notice: Subject to any disclaimer, the term of this patent is extended or adjusted under 35 U.S.C. 154(b) by 86 days.

(21) Appl. No.: 11/613,869

(22) Filed: Dec. 20, 2006

(65) Prior Publication Data
US 2008/0150654 A1 Jun. 26, 2008

(51) Int. Cl.
*H03H 9/125* (2006.01)
*H03H 9/24* (2006.01)
*H03B 5/30* (2006.01)
*H03H 9/46* (2006.01)

(52) U.S. Cl. .................. 333/186; 333/197; 333/200; 310/309; 310/370; 331/154; 331/156

(58) Field of Classification Search ............. 333/186, 333/197, 200; 310/367, 368, 370, 309; 331/154, 331/156
See application file for complete search history.

(56) References Cited

U.S. PATENT DOCUMENTS

| 6,831,531 | B1 * | 12/2004 | Giousouf et al. | ............. | 333/200 |
| 7,360,423 | B2 * | 4/2008 | Ayazi et al. | ............. | 73/504.12 |
| 2004/0135466 | A1 | 7/2004 | Higuchi | | |
| 2005/0046518 | A1 | 3/2005 | Zurcher et al. | | |
| 2005/0151442 | A1 | 7/2005 | Kihara et al. | | |

OTHER PUBLICATIONS

Ye et al., "Optimal Shape Design of an Electrostatic Comb Drive in Microelectromechanical Systems", Journal of Microelectromechanical Systems, vol. 7, No. 1, Mar. 1988, pp. 16-26.
Rosa et al., "Enhanced Electrostatic Force Generation Capability of Angled Comb Finger Design Used in Electrostatic Comb-Drive Actuators", Electronics Letters, vol. 34, No. 18, Sep. 1998, pp. 1787-1788.
International Search Report. Nov. 7, 2008.

* cited by examiner

*Primary Examiner*—Barbara Summons
(74) *Attorney, Agent, or Firm*—Patterson & Sheridan LLP

(57) ABSTRACT

One embodiment of the present invention sets forth a serrated tooth actuator for driving MEMS resonator structures. The actuator includes a fixed drive electrode having a serrated tooth surface opposing a MEMS resonator arm also having a serrated tooth surface, where the MEMS resonator arm is configured to rotate towards the drive electrode when an AC signal is applied to the drive electrode. Such a configuration permits higher amplitude signals to be applied to the drive electrode without the performance of the actuator being compromised by nonlinear effects. In addition, the serrated tooth configuration enables a sufficiently high actuating force to be maintained even though the distance traversed by the MEMS resonator arm during operation is quite small. Further, the serrated configuration allows a MEMS resonator system to withstand larger fluctuations in voltage and larger substrate stresses without experiencing a substantial shift in resonant frequency.

22 Claims, 15 Drawing Sheets

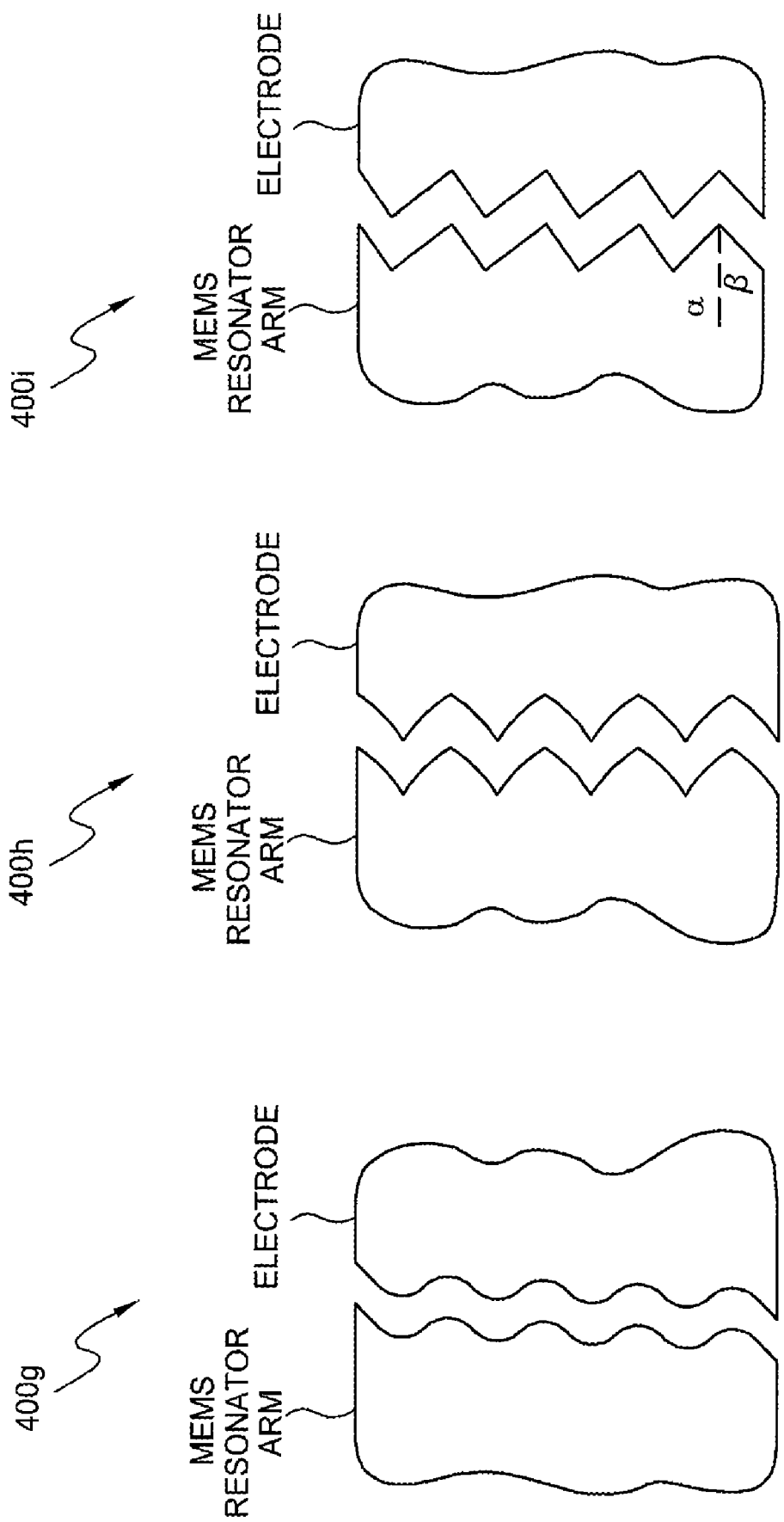

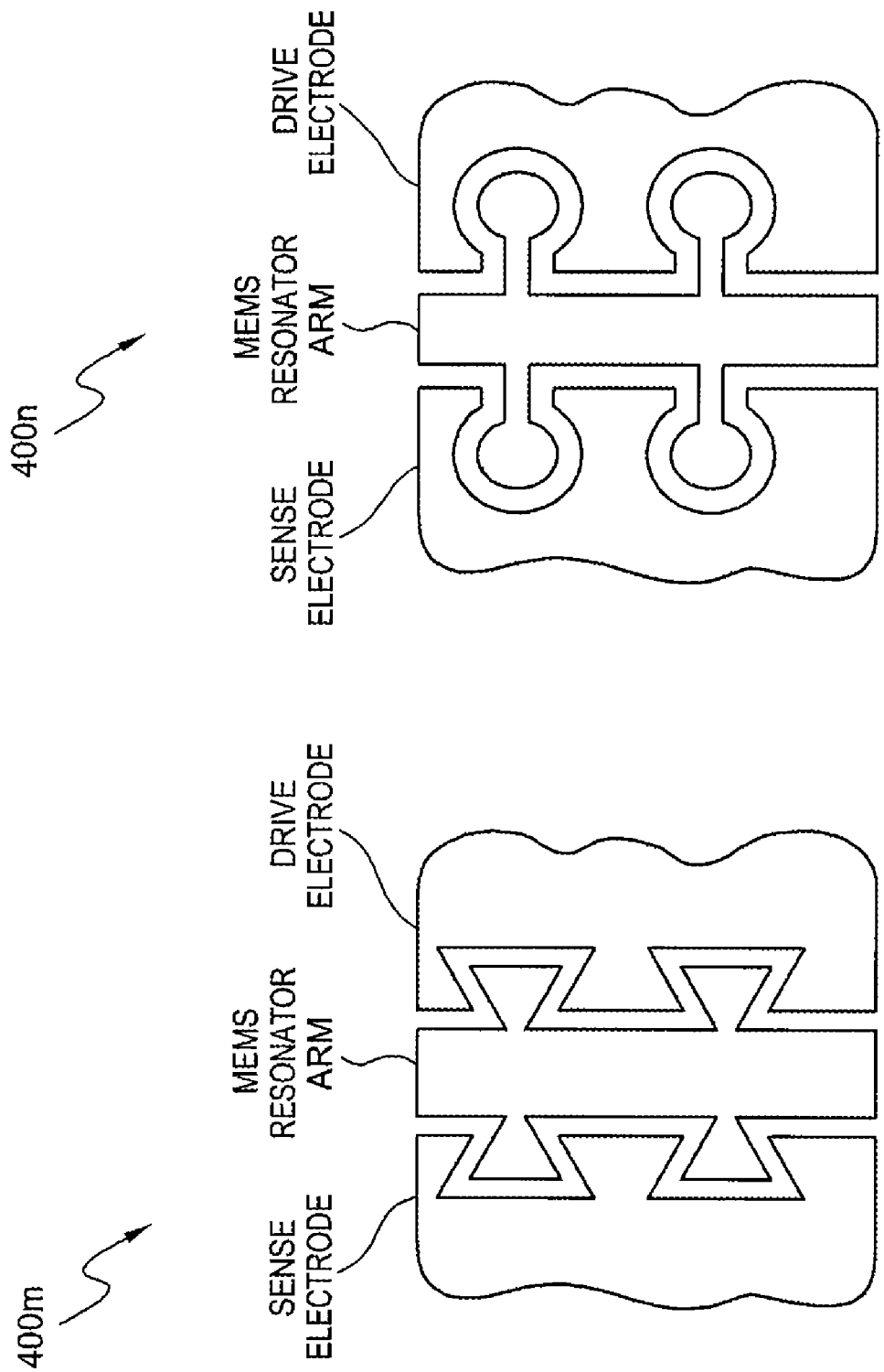

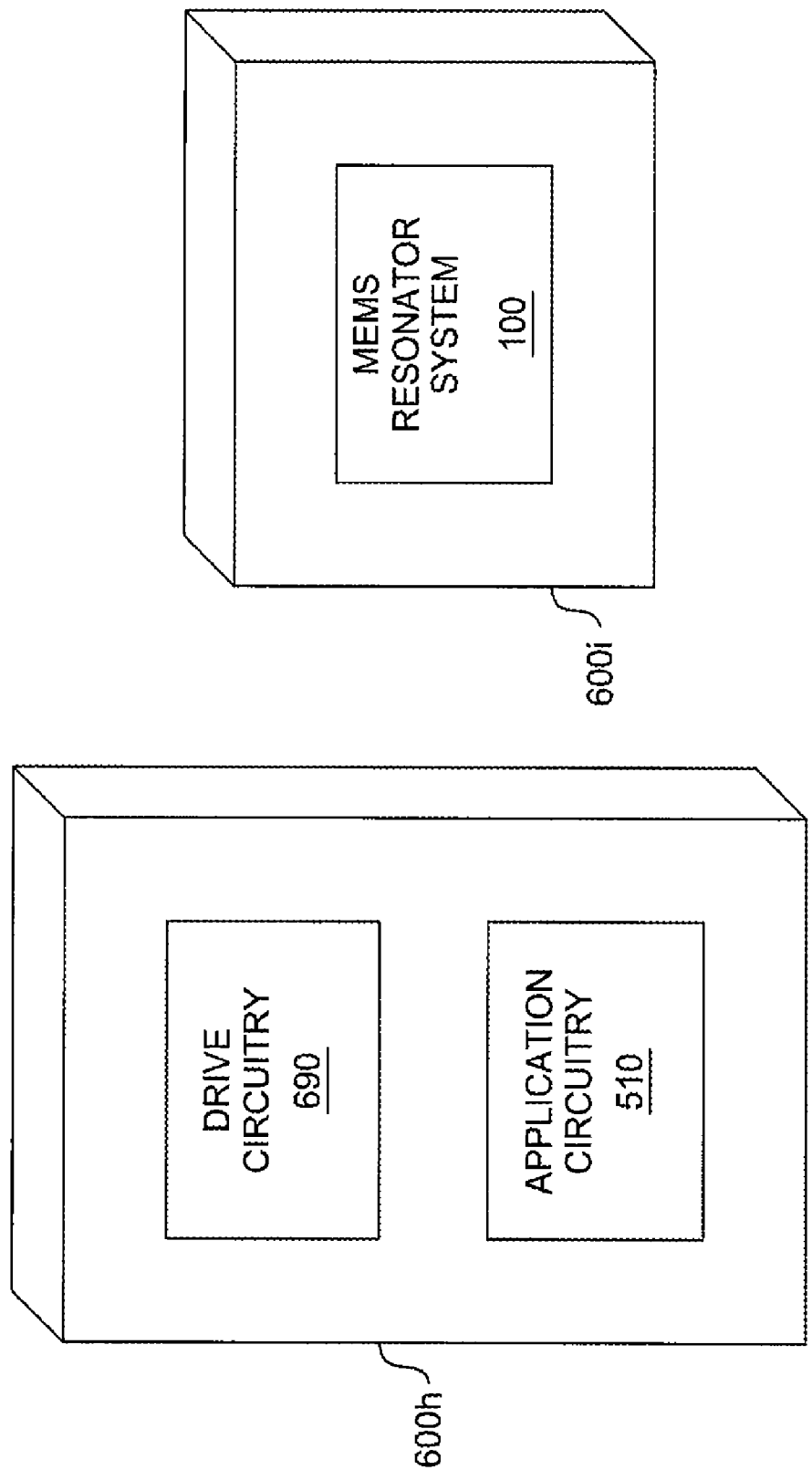

SERRATED MEMS RESONATORS

BACKGROUND OF THE INVENTION

1. Field of the Invention

Embodiments of the present invention generally relate to microelectromechanical systems and, more specifically, to serrated MEMS resonators.

2. Description of the Related Art

Microelectromechanical system (MEMS) devices are currently being developed for a wide variety of applications. One example of such a device is a MEMS resonator, which can be used in the timing circuitry of electronic devices. MEMS resonator systems typically include multiple electrodes to drive the MEMS resonator. As is well-known, when a bias is applied to a drive electrode, a charge builds up on the electrode that generates an electrostatic force between the electrode and an opposite charge built up on the MEMS resonator. By applying a time-varying voltage signal to the drive electrode, often in combination with a DC voltage, a time-varying electrostatic force can be generated that causes the MEMS resonator to oscillate. Since the electrostatic force across the surfaces of the MEMS resonator and the drive electrode causes the MEMS resonator to move, the region of a MEMS resonator system that includes the surface of a drive electrode and the opposing surface of the MEMS resonator is referred herein to as an "actuator."

Much of the MEMS resonator research to date has focused on parallel plate actuators (i.e., where the opposing surfaces of the MEMS resonator and the electrode can be modeled as two parallel plates). However, such an actuator configuration has certain drawbacks. First, as the drive voltage amplitude is increased, the nonlinear components of the electrostatic force produced by a parallel plate actuator increase and can modify the resonant frequency of the resonator system. Thus, there is an upper limit on the useful range of drive voltage amplitudes that parallel plate actuators can accommodate. In addition, a parallel plate geometry generally causes a MEMS resonator to be quite sensitive to drive voltage and DC bias voltage fluctuations as well as substrate stresses. Each of these phenomena can change the electrostatic spring properties of the resonator system, resulting in an undesirable shift in the resonant frequency of the system.

Other research has shown that comb actuators (i.e., where the opposing surfaces of the MEMS resonator and the electrode are configured as interleaving prismatic comb fingers) are able to accommodate a wider range of drive voltage and displacement amplitudes relative to parallel-plate actuators with the same electrode gap width. However, prismatic comb geometries generally result in reduced actuating force relative to parallel-plate geometry of equivalent size, meaning that prismatic comb actuators require higher voltage to achieve the same performance, making prismatic comb actuators undesirable for low-power MEMS applications. And while triangular comb actuators have the advantage of comparable electrostatic force to parallel plate actuators and are able to accommodate a wider drive voltage range, triangular comb actuator designs have a triangular tooth electrode shape attached to a rigid translational structure. Since MEMS structures usually are not purely translational, the rigid translational structure of a typical triangular comb actuator is generally unsuitable for many MEMS implementations.

As the foregoing illustrates, what is needed in the art is a MEMS actuator design that can accommodate a wide range of drive voltage amplitudes without experiencing a substantial reduction in actuating force on a structure that has a rotational component.

SUMMARY OF THE INVENTION

One embodiment of the present invention sets forth a microelectromechanical system (MEMS) for generating a timing signal. The system comprises a MEMS resonator that includes a first member having a serrated surface comprised of a first plurality of teeth, and a first drive electrode having a serrated surface comprised of a second plurality of teeth that opposes the serrated surface of the first member. The teeth in the first plurality are interleaved with the teeth in the second plurality when the first member is stationary, and the first member is configured to rotate towards the first drive electrode when a voltage is applied across the first member and the first drive electrode.

One advantage of the disclosed system is that such a configuration permits higher amplitude signals to be applied to the drive electrode without the performance of the system being compromised by nonlinear effects. In addition, the serrated electrode configuration enables a sufficiently high actuating force to be maintained even though the distance traversed by the MEMS resonator arm during operation is quite small. Further, the serrated electrode configuration allows a MEMS resonator system to withstand larger fluctuations in voltage and larger substrate stresses without experiencing a substantial shift in resonant frequency.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIGS. 6A through 6E illustrate various ways to position a MEMS resonator, a drive circuit, and application circuitry on one or more substrates, according to different embodiments of the present invention.

DETAILED DESCRIPTION

Figure 1:
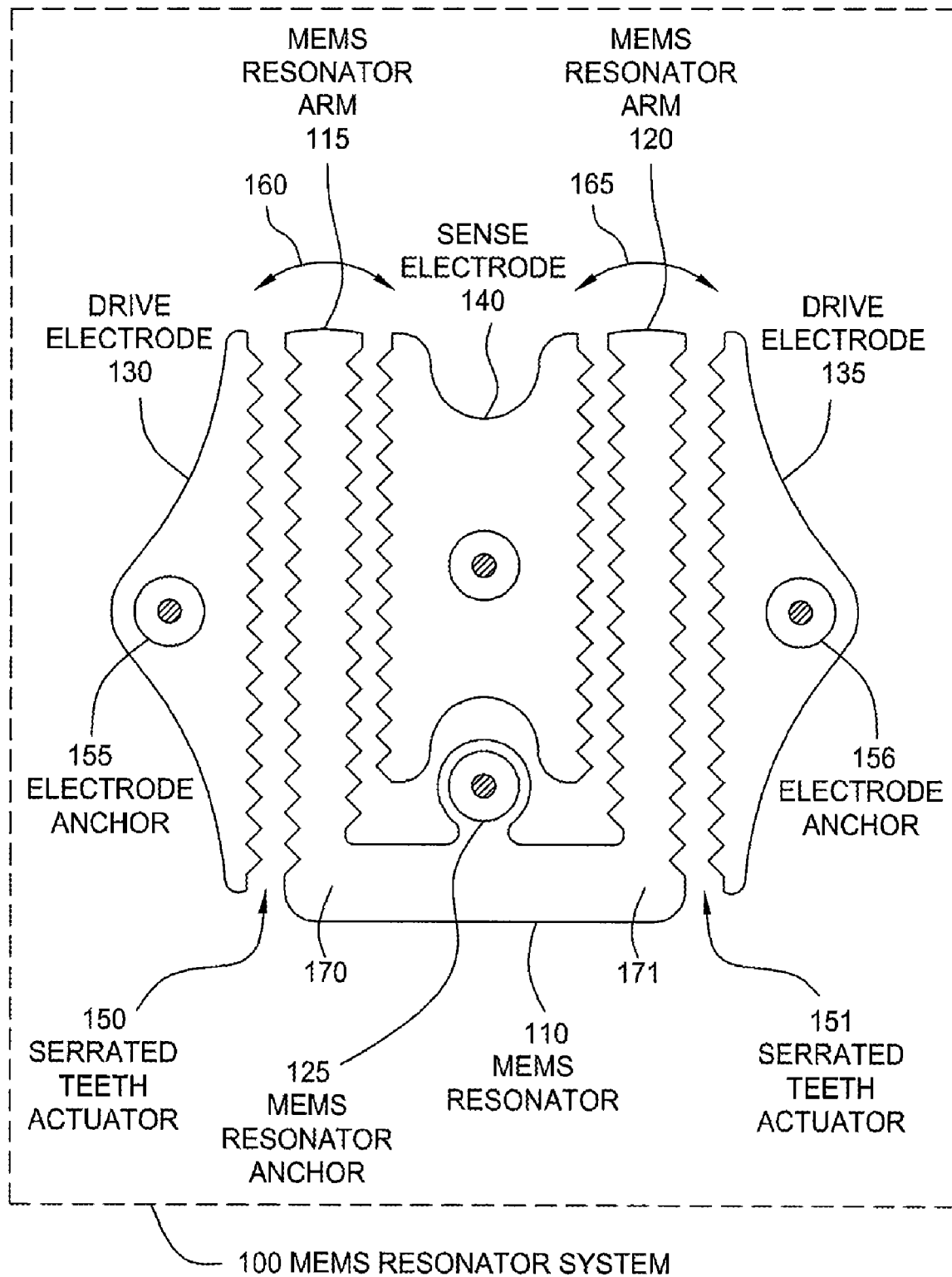
FIG. 1 is a conceptual diagram of a MEMS resonator system, according to one embodiment of the present invention.

FIG. 1 is a conceptual diagram of a MEMS resonator system 100, according to one embodiment of the present invention. As shown, the MEMS resonator system 100 includes, without limitation, a MEMS resonator 110, drive electrodes 130 and 135, and a sense electrode 140. The MEMS resonator 110 includes MEMS resonator arms 115 and 120 that are mechanically coupled. As previously described herein, by applying a time-varying signal to drive electrodes 130 and 135 at a given frequency and, optionally, a DC voltage between the MEMS resonator 110 and drive electrodes 130 and 135, electrostatic forces are generated that cause the MEMS resonator arms 115 and 120 to oscillate in a tuning fork fashion, as indicated by arrows 160 and 165, respectively. In response to the motion of the MEMS resonator arms 115 and 120, the average capacitance between the sense electrode 140 and the MEMS resonator arms 115 and 120 changes at a substantially constant frequency. Thus, the capacitance can be measured, and resulting signal can then be used to generate a timing signal.

As also shown, a serrated electrode actuator 151 is defined by a serrated surface of the drive electrode 135 and an opposing serrated surface of the MEMS resonator arm 120. The drive electrode 135 is fixed to an underlying substrate (not shown) by an electrode anchor 156, but only the base of the MEMS resonator 110 is fixed to the substrate by a MEMS resonator anchor 125. Therefore, when a voltage is established between the drive electrode 135 and the MEMS resonator arm 120, the resulting electrostatic force causes the MEMS resonator arm 120 to rotate about a pivot point 171 and bend towards the drive electrode 135, and then back towards the sense electrode 140, again, by rotating about the pivot point 171 and bending. In alternative embodiments, the MEMS resonator arm 120 may bend during operation without substantial rotation. Optionally, the MEMS resonator arm 120 may rotate without substantial bending. Those skilled in the art will recognize that the pivot point 171 may define a "pivot" axis that is perpendicular to the page in which FIG. 1 is illustrated. A vertical axis and a horizontal axis may also be defined that are both perpendicular to the pivot axis and perpendicular to one another. The drive electrode 135 and the serrated electrode actuator 151 are aligned substantially parallel to the vertical axis. When stationary, the MEMS resonator arm 120 is also aligned substantially parallel to the vertical axis.

A benefit of using only one MEMS resonator anchor 125 is that mechanical strain in the substrate minimally couples strain into the MEMS resonator 110, minimizing the sensitivity of the resonator frequency to substrate stress. In alternative embodiments, the MEMS resonator anchor 125 and the pivot point 171 may be one in the same. For other applications, including strain sensing, the MEMS resonator arm 120 may be fixed at both ends (i.e., by two resonator anchors) or otherwise configured not to move at either end (i.e., when a "node" exists at both ends of the MEMS resonator arm).

In one embodiment, the MEMS resonator arm 120 is approximately 200 micrometers (microns) in length, and each tooth on both the MEMS resonator arm 120 and the opposing surface of the drive electrode 135 is approximately 6 microns long. When stationary, the teeth on the MEMS resonator arm 120 are interleaved with the teeth on the drive electrode 135. Further, the gap (g) between the planar faces of each tooth on the MEMS resonator arm 120 and the planar faces of the opposing teeth on the drive electrode 135 (as more clearly illustrated in FIG. 2) is approximately 400 nanometers. During operation, when the MEMS resonator arm 120 rotates towards the drive electrode 135, the gaps between the planar faces of the serrated electrode near the upper portion of the MEMS resonator arm 120 (i.e., away from the MEMS resonator anchor 125) and the planar faces of the opposing serrated electrode on the drive electrode 135 reduce to approximately 200 nanometers. Persons skilled in the art will recognize that, in alternative embodiments, the length of the MEMS resonator arm 120 and the gaps between the planar faces of the teeth on the MEMS resonator arm 120 and the planar faces of the opposing teeth on the drive electrode 135 when the MEMS resonator arm 120 is stationary, can have any values, and the teeth can have any configuration(s), so long as none of the teeth on the MEMS resonator arm 120 contact any of the teeth on the drive electrode 135 during operation.

Figure 2:
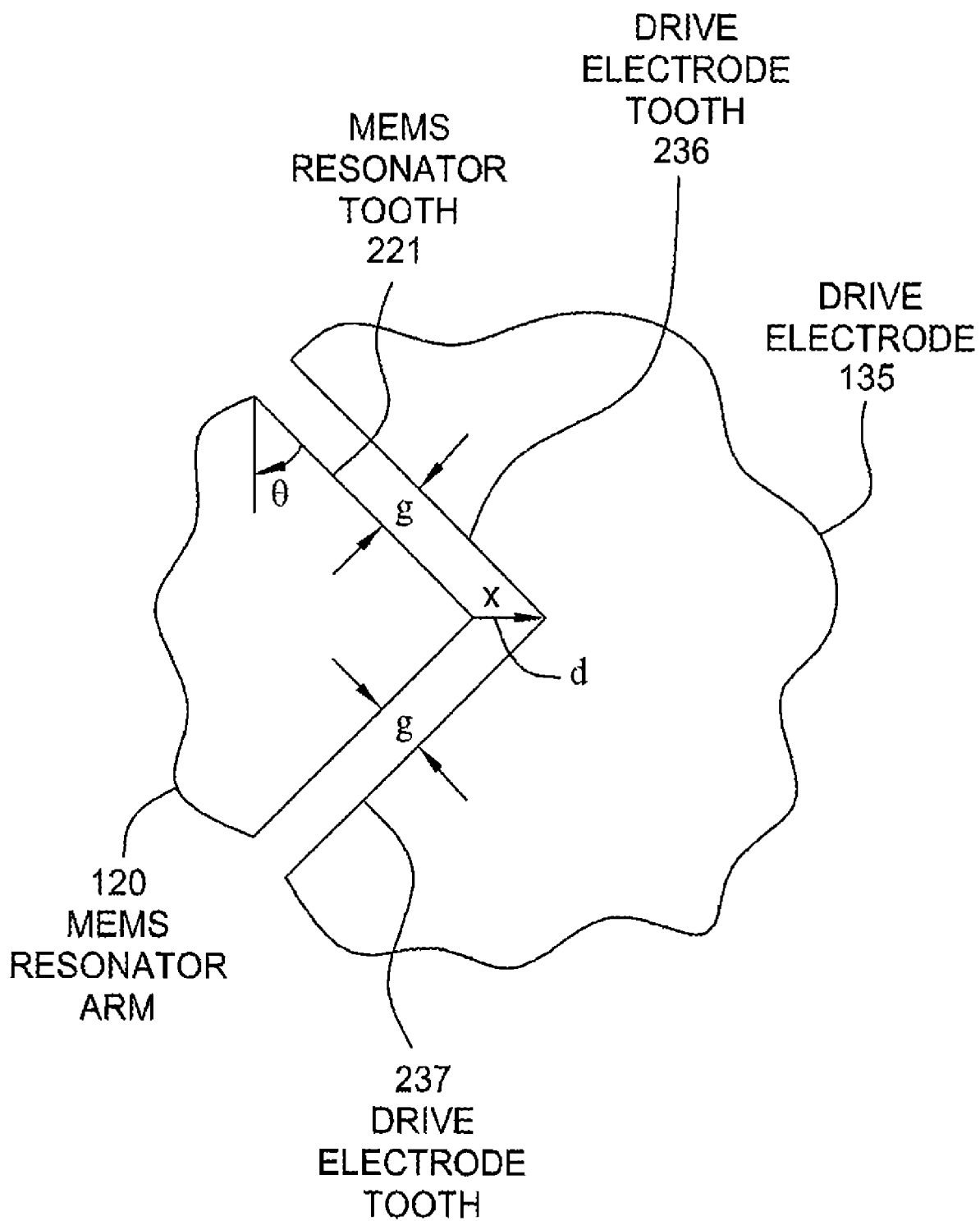
FIG. 2 illustrates the geometric relationships between a tooth of a MEMS resonator arm and the two opposing teeth of a drive electrode, according to one embodiment of the present invention.

As persons skilled in the art will recognize, one consequence of using a serrated electrode configuration, as opposed to a comb electrode configuration, is that the capacitance between the MEMS resonator arm 120 and the drive electrode 135 is more sensitive to lateral displacements of the MEMS resonator arm 120 (denoted as "x" in FIG. 2). As is well-known, the actuating force generated between the MEMS resonator arm 120 and the drive electrode 135 is directly related to the derivative of this capacitance with respect to the lateral displacement, x. Thus, for very small lateral displacements, like those experienced by the MEMS resonator arm 120 during operation, the serrated electrode configuration produces an actuating force that is substantially greater than that actuating force that a comb electrode configuration could produce. In addition, since the teeth in a serrated electrode configuration are typically shorter than the fingers in a comb electrode configuration, the serrated electrode configuration is better able to accommodate the non-lateral motion of the MEMS resonator arm 120 during operation (i.e., rotating and/or bending). For example, with long comb fingers, rotating or bending could more easily result in the interleaved fingers contacting one another during operation, which could cause the MEMS resonator system 100 to fail. In addition, if the MEMS resonator 110 bends or rotates, the resonator arm 120 obtains a small component of displacement perpendicular to the desired direction of motion. Shorter, triangular-shaped teeth reduce non-lateral electrostatic forces resulting from this displacement. It is desired to reduce non-lateral forces to minimize the radiation of energy through the resonator's attachment point to the substrate (in this case, the MEMS resonator anchor 125). This effect, called anchor loss, occurs due to forces applied on the MEMS resonator anchor 125 by the MEMS resonator 110.

In addition, FIG. 1 also depicts a second serrated electrode actuator 150, having the equivalent geometry and functionality as serrated electrode actuator 151 described above, defined by a serrated surface of the drive electrode 130 and an opposing serrated surface of the MEMS resonator arm 115. Here, the drive electrode 130 is fixed to the substrate by an electrode anchor 155, and the MEMS resonator arm 115 pivots and/or bends about a pivot point 170 in response to the time-varying signal being applied to the drive electrode 130. Those skilled in the art will recognize that the pivot point 170 may also define a pivot axis that is perpendicular to the page on which FIG. 1 is illustrated. A vertical axis and a horizontal axis may also be defined that are both perpendicular to the pivot axis and perpendicular to one another. The drive electrode 130 and the serrated electrode actuator 150 are aligned substantially parallel to the vertical axis. When stationary, the MEMS resonator arm 115 is also aligned substantially parallel to the vertical axis.

An additional benefit of the serrated electrode configuration is improved spectral purity of the output signal on the sense electrode 140. The serrations on both sides of the sense electrode 140 helps reduce the power of the higher-order harmonics on the output current of the MEMS resonator system 100. Improved spectral purity of the MEMS resonator system 100 may lead to improved performance of an attached oscillator circuit, such as reduced jitter in the output signal.

In addition to the foregoing, as two MEMS resonator arms were coupled together in FIG. 1, similarly four or more MEMS resonator arms may be coupled together to produce a MEMS resonator with a larger electrode area, thereby generating a stronger output signal.

FIG. 2 illustrates the geometric relationships between a tooth 221 of the MEMS resonator arm 120 and the two opposing teeth 236 and 237 of the drive electrode 135, according to one embodiment of the present invention. As shown, θ refers to the angle of the serration of tooth 221, g refers to the gap between the planar faces of tooth 221 and the planar faces of teeth 236 and 237, x refers to the lateral displacement of the MEMS resonator arm 120, and d refers to the distance from the tooth 221 to the drive electrode 135, as measured in the same direction as x from the tip of the serrated tooth 221. The angle θ may range from 0 degrees to nearly 90 degrees. Note that at angle θ=90 degrees the equivalent of a prismatic comb tooth exists, with zero width and infinite length, which is a configuration not physically realizable. The distance d is greater than the gap g and may be determined as follows:

$$d = \frac{1}{\cos\theta} \cdot g$$

The maximum current that can be driven through the MEMS resonator 110 before the nonlinear components of the electrostatic force substantially modify the resonant frequency may be calculated by modeling the MEMS resonator system 100 as a spring-mass system. Due to the nonlinearity of electrostatic force, there exists a critical drive current where the solution for the vibration amplitude bifurcates. At that point, there is a substantial modification in the resonator frequency. This bifurcation point may be used as a figure of merit to compare the maximum drive current in different actuator systems. In such systems, the maximum current, $i_{max}$, of the MEMS resonator system 100 becomes:

$$i_{max} \propto \frac{\sqrt{A}}{(\cos\theta)^{3/2}},$$

where A is an area equivalent to the length of the MEMS resonator arm 120 multiplied by the thickness of the MEMS resonator arm 120 (measured perpendicular to the page in FIG. 1). With a parallel plate configuration, the angle θ is 0 degrees; therefore, the denominator of the above equation is one. However, with a serrated electrode configuration, the angle θ is greater than 0 degrees; therefore, the denominator of the above equation becomes less than one. Thus, by adjusting the angle of the serration, the range of drive current amplitudes that the MEMS resonator 110 can accommodate before the nonlinear components of the electrostatic force start to modify the resonant frequency may be extended relative to a parallel plate actuator design.

The resonant frequency of the MEMS resonator arm 120 in response to a time-varying voltage between drive electrode 135 and MEMS resonator arm 120 may be analyzed in a similar fashion. As is well-known, an electrostatic force, $F_{electrostatic}$, between two surfaces may be calculated as follows:

$$F_{electrostatic} = -\frac{1}{2} \cdot V^2 \cdot \frac{dC}{dx},$$

where V is the applied voltage, and C is the capacitance between the two surfaces. With a serrated electrode configuration, the electrostatic force, $F_{serrated}$, between the serrated surface of the MEMS resonator arm 120 and the serrated surface of the drive electrode 135 may be calculated as:

$$F_{serrated} = -\frac{1}{2} \cdot V^2 \cdot \frac{dC_s}{dx},$$

where V is the voltage applied to the drive electrode 135, and $C_s$ is the capacitance between the serrated surfaces of the MEMS resonator arm 120 and the drive electrode 135. The capacitance $C_s$ may be determined as:

$$C_s = \frac{\varepsilon_0 \cdot \frac{A}{\cos\theta}}{g - x \cdot \cos\theta},$$

where A is an area equivalent to the length of the MEMS resonator arm 120 multiplied by the thickness of the MEMS resonator arm 120 (measured perpendicular to the page in FIG. 1), and $\epsilon_0$ is the dielectric permittivity in a vacuum. Therefore, $$\frac{dC_s}{dx}$$

equals:

$$\frac{dC_s}{dx} = \frac{\varepsilon_0 \cdot A}{(g - x \cdot \cos\theta)^2}$$

Substituting $$\frac{dC_s}{dx}$$

into the above expression for $F_{serrated}$ yields:

$$F_{serrated} = -\frac{1}{2} \cdot \frac{\varepsilon_0 \cdot A \cdot V^2}{(g - x \cdot \cos\theta)^2}$$

The equation above shows that force of the serrated electrode actuator (θ≠0) and the parallel plate actuator (θ=0) are the same at x=0. The sensitivity of a variable to a particular parameter is determined by inspecting the first derivative of the variable with respect to that parameter. The derivatives of the electrostatic force $F_{serrated}$ with respect to the lateral displacement x and the applied voltage V are:

$$\frac{dF_{serrated}}{dx} = -\frac{\varepsilon_0 \cdot A \cdot V^2 \cdot \cos\theta}{(g - x \cdot \cos\theta)^3},$$

and $$\frac{dF_{serrated}}{dV} = -\frac{\varepsilon_0 \cdot A \cdot V}{(g - x \cdot \cos\theta)^2},$$

respectively.

As seen from these expressions, when the angle θ is greater than 0 degrees, as with a serrated tooth configuration, the magnitude of the derivatives of the electrostatic force with respect to both the lateral distance x and the applied voltage V are generally smaller than those corresponding to θ=0 degrees, the parallel plate configuration. Thus, the serrated tooth configuration provides reduced sensitivity to variations in applied voltage and distance between the MEMS resonator arm 120 and the drive electrode 135 compared to a parallel plate configuration, without sacrificing force at x=0.

Reduced sensitivity to variations in the applied voltage and the distance between the MEMS resonator arm 120 and the drive electrode 135 has several consequences. First, the above properties reduce the sensitivity of the electrostatic spring constant of the MEMS resonator system 100 to variations in the time-varying and fixed DC drive voltages. Therefore, the resonant frequency of the system is less likely to shift if the drive signal fluctuates. The reduced sensitivity also allows a simpler control system to be implemented for controlling the drive voltage, which may save power and provide more space in the system for other components. Second, a reduced sensitivity to variations in the distance between the MEMS resonator arm 120 and the drive electrode 135 enables the MEMS structure to withstand more variation in the width of the gap g in FIG. 2 and to substrate stresses. The performance of the MEMS resonator system 100 is highly dependent upon with width of gap g, which may vary due to changes in photolithography or etch processes. The serrated electrode configuration provides an advantageous reduction in sensitivity to these changes. Some of the fabrication steps (such as those involving large variations in temperature, for example) and device packaging steps induce stresses on the underlying substrate that can strain the substrate, causing the distance between the MEMS resonator arm 120 and the drive electrode 135 to change. Typically, stringent requirements are imposed on the device design, fabrication and packaging steps in order to minimize such substrate stresses. However, if the structure is able to withstand more substrate stress, less stringent requirements may be applied, and the device may yield better frequency stability.

Figure 3:
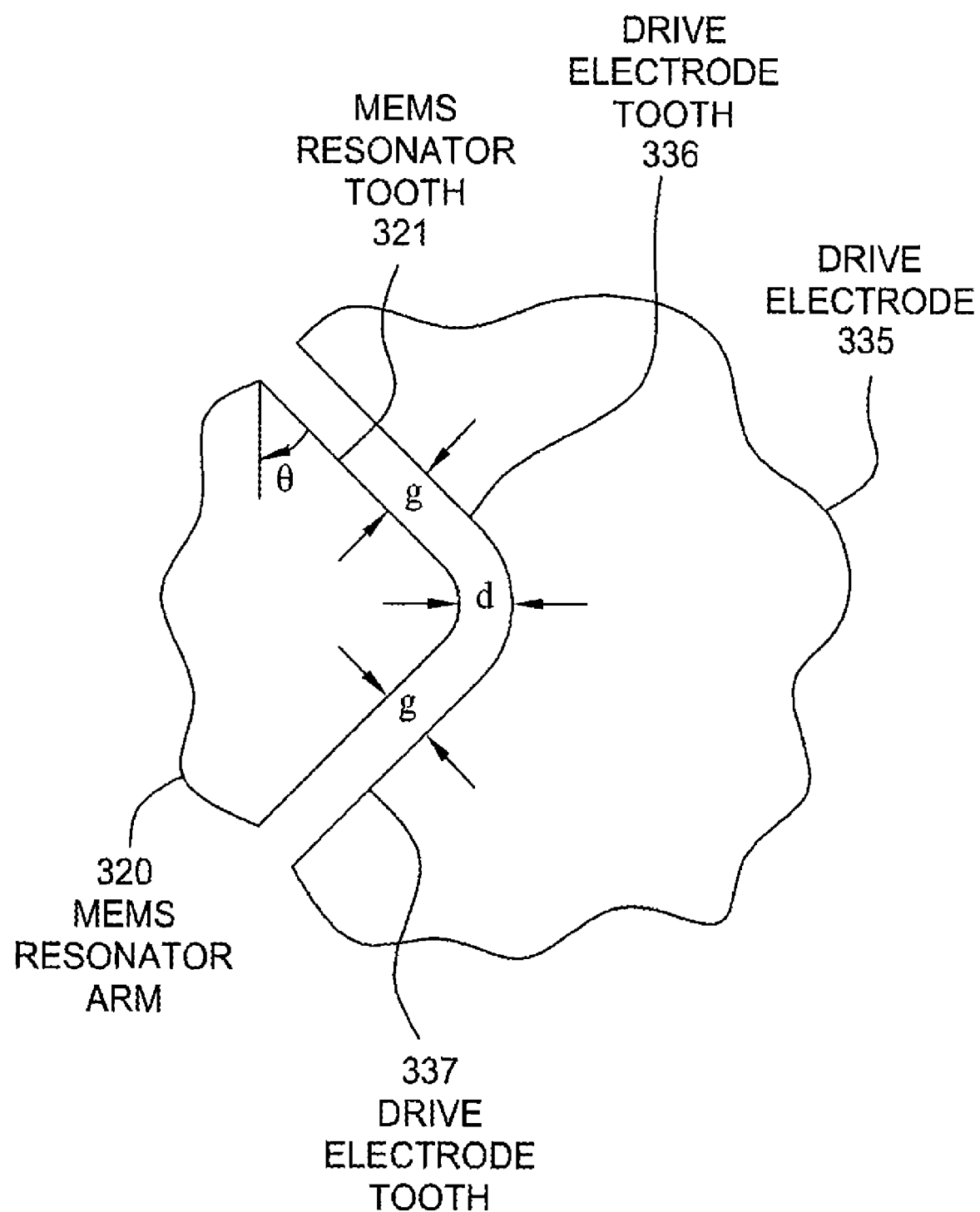
FIG. 3 illustrates the use of rounded teeth on both a MEMS resonator arm and a drive electrode, according to another embodiment of the present invention.

FIG. 3 illustrates the use of a rounded tooth configuration for a tooth 321 of a MEMS resonator arm 320 and two opposing teeth 336 and 337 of a drive electrode 335, according to another embodiment of the present invention. As shown, the apex of the serrated tooth 321 and the opposing surface of the drive electrode 335, where the serrated teeth 336 and 337 come together, are rounded. Importantly, the rounded portions of the serrated tooth 321 and the opposing surface of drive electrode 335 are configured such that there is a substantially constant gap g between the MEMS resonator arm 320 and the drive electrode 335 when the MEMS resonator arm 320 is not deflected. The gap g between the planar faces of the serrated tooth 321 and the opposing planar faces of the serrated teeth 336 and 337 is substantially equal to the distance d between the rounded portion of the serrated tooth 321 and the rounded portion of the drive electrode 335.

The rounded-tooth electrode configuration advantageously reduces the distance d compared to the serrated electrode configuration depicted in FIG. 2, where d is greater than g by a factor of $$\frac{1}{\cos\theta}.$$

By reducing d, less oxide is needed to fill the gap between the MEMS resonator arm 320 and the drive electrode 335 during some fabrication processes, making the rounded-tooth electrode configuration particularly well-suited for conventional MEMS fabrication processes and processes that include wafer-scale encapsulation. For example, if less oxide is required, then the oxide deposition step takes less time and requires less material. Further, the subsequent etch step also takes less time. Consequently, overall fabrication time and cost may be reduced. Also, with less oxide, the risk of stress-induced cracking is reduced, which can be especially important during or after an annealing step. In addition to the foregoing, less oxide reduces the amount of stress on the underlying substrate, which, as described previously herein, may make the MEMS resonator system 100 mechanically more robust.

Persons skilled in the art will understand that, although specific to a particular MEMS resonator arm and drive electrode, the teachings of FIGS. 2 and 3 apply with equal force to any MEMS resonator arm/drive electrode pair in a MEMS resonator system. Similarly, even though FIGS. 2 and 3 focus on the geometric relationships between a serrated tooth on a MEMS resonator arm and the opposing serrated teeth on a drive electrode, those teachings also apply with equal force to the geometric relationships between a serrated tooth on a drive electrode and the opposing serrated teeth on a MEMS resonator arm. Furthermore, the teachings of any MEMS resonator arm/drive electrode pair apply equally to any MEMS resonator arm/sense electrode pair.

Figure 4B:
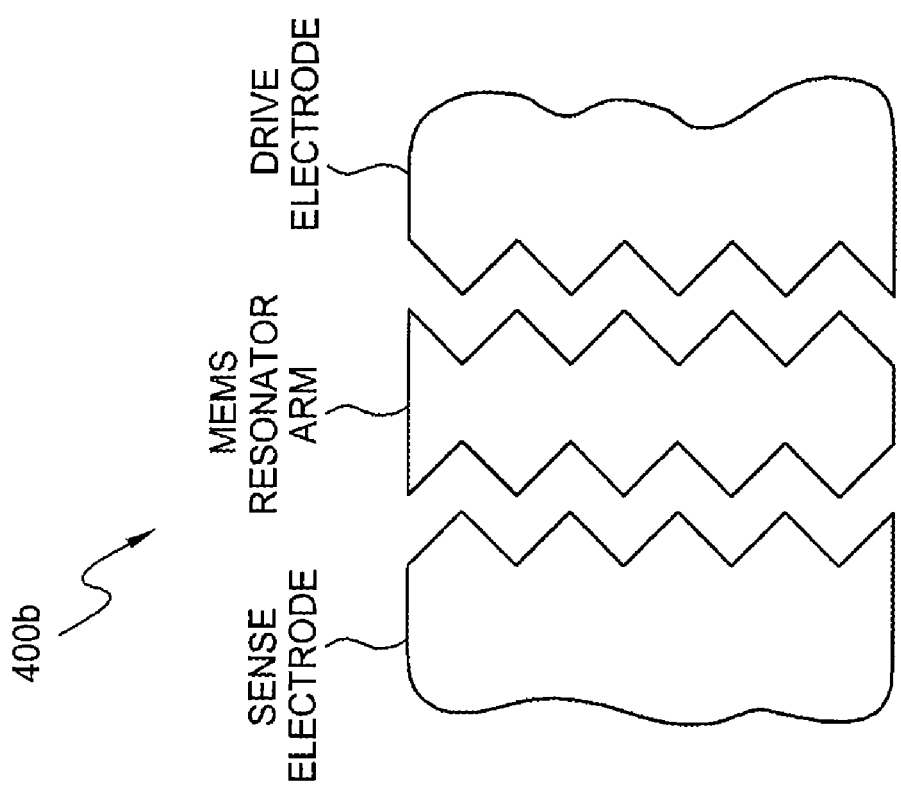
FIGS. 4A through 4N illustrate various serrated electrode configurations, according to different embodiments of the present invention.
Figure 4A:
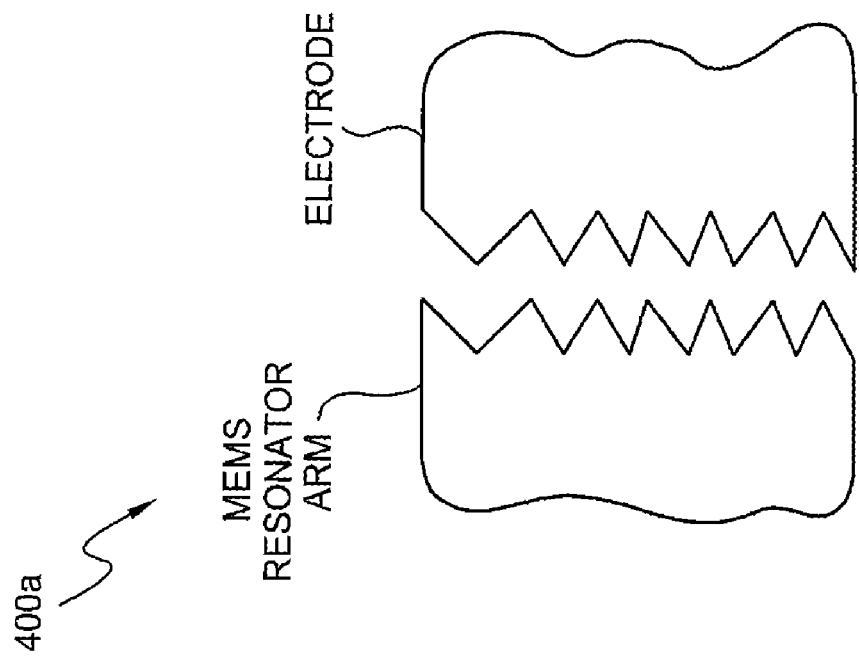
Figure 4D:
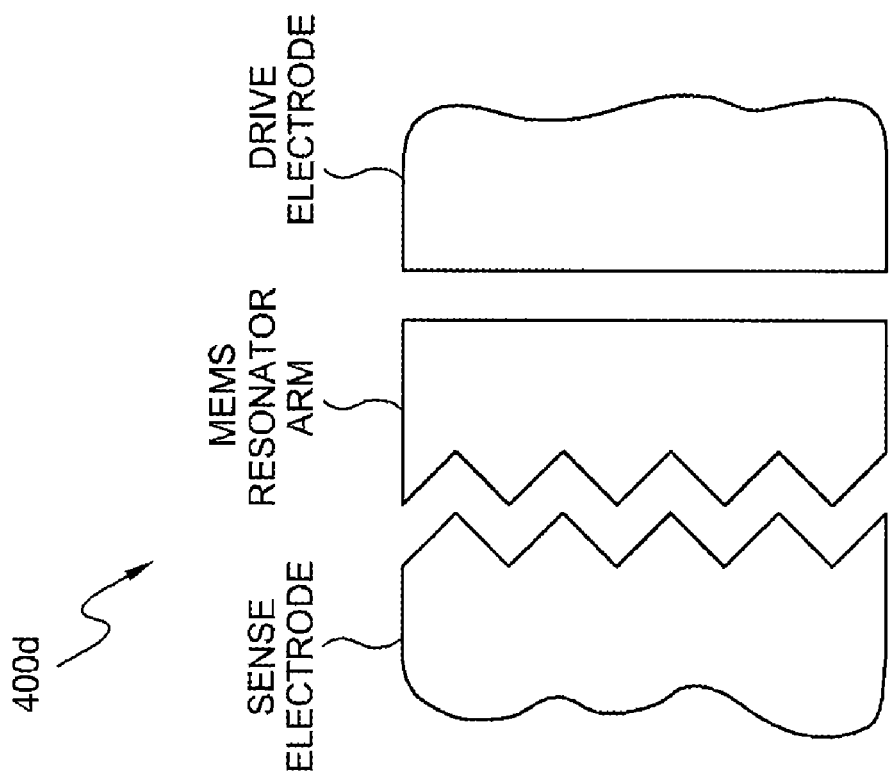
Figure 4C:
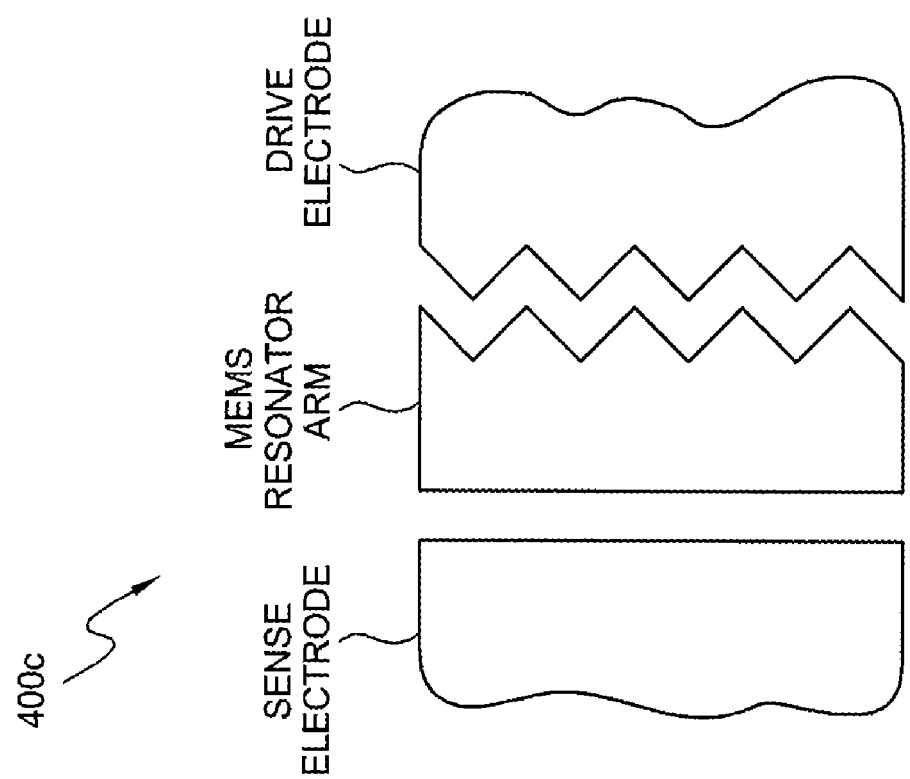
Figure 4F:
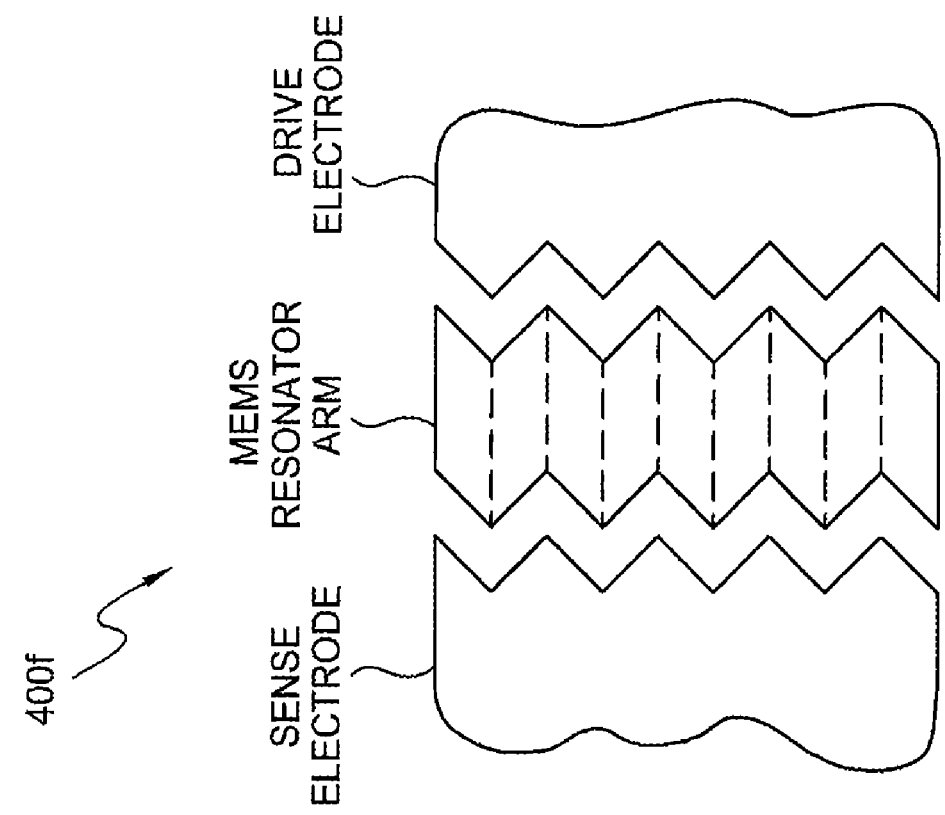
Figure 4E:
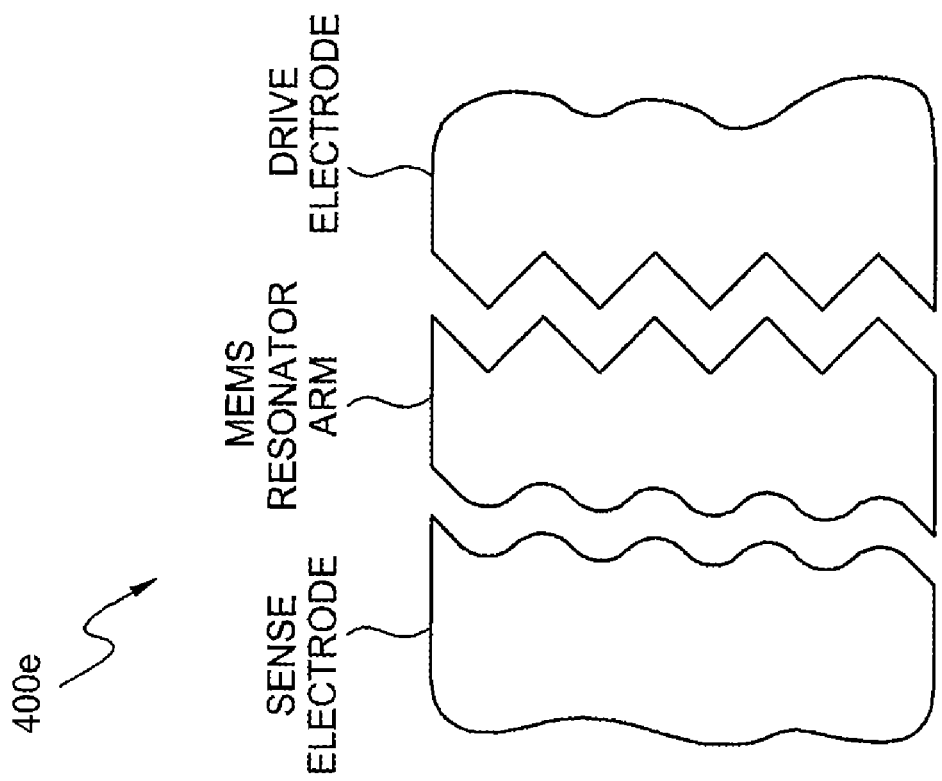
Figures 4J, 4K, 4L:
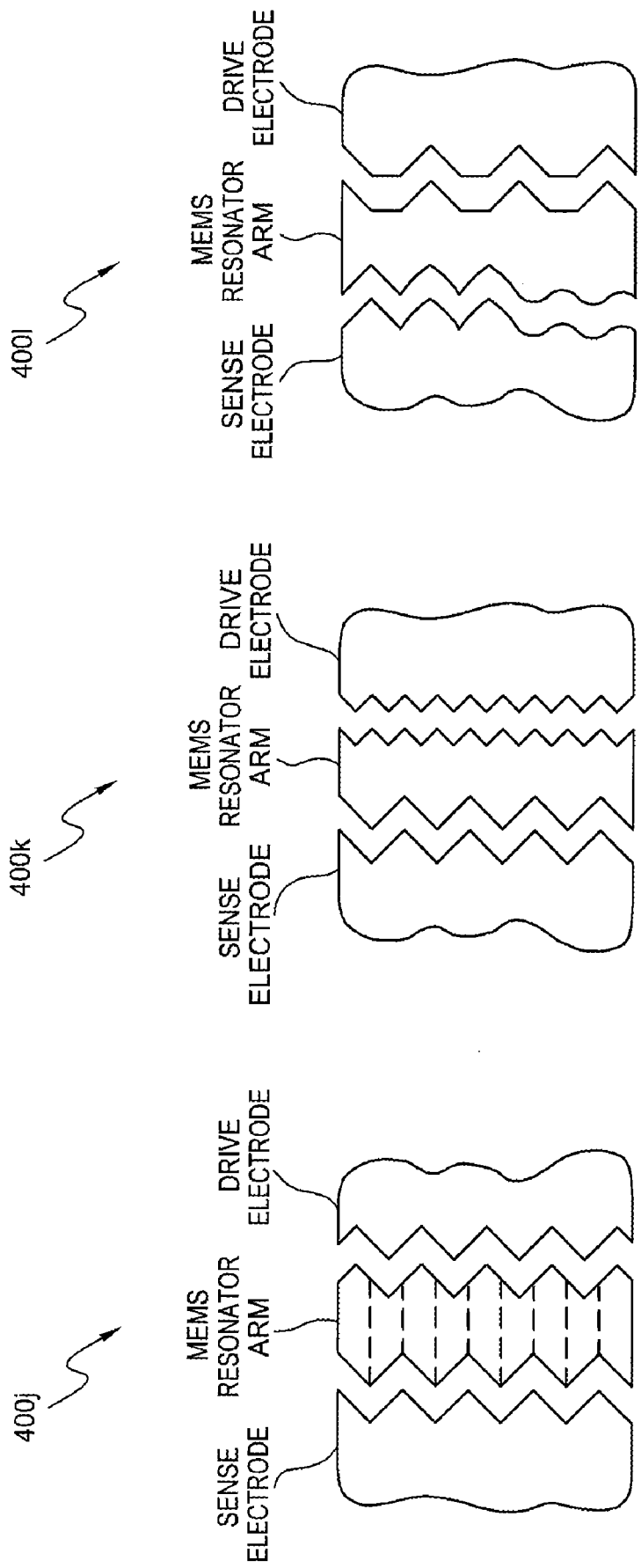

FIGS. 4A through 4N illustrate various serrated electrode configurations, according to different embodiments of the present invention. FIG. 4A shows that the angle of serration may vary over the lengths of the MEMS resonator arm and the electrode. FIG. 4B shows that the serration may exist symmetrically on both the sense electrode and the drive electrode sides of the MEMS resonator arm. FIG. 4C shows that the serration may exist exclusively on the drive electrode side of the MEMS resonator arm, while the sense electrode side of the MEMS resonator arm may be configured as a parallel plate. FIG. 4D shows that the serration may exist exclusively on the sense electrode side of the MEMS resonator arm, while the drive electrode side of the MEMS resonator arm may be configured as a parallel plate. FIG. 4E shows the use of a sinusoidal electrode profile on the surface of the sense electrode and the sense electrode side of the MEMS resonator arm and a serrated electrode profile on the surface of the drive electrode and the drive electrode side of the MEMS resonator arm. FIG. 4F shows that the teeth on the sense electrode side of the MEMS resonator arm may match the teeth on the drive electrode side of the MEMS resonator arm. FIG. 4G shows the use of a sinusoidal electrode profile. FIG. 4H illustrates an "arc-to-point" electrode profile. FIG. 4I illustrates a "skewed teeth" electrode profile. FIG. 4J shows that the teeth on the sense electrode side of the MEMS resonator arm may be offset from the teeth on the drive electrode side of the MEMS resonator arm. FIG. 4K shows that different numbers of teeth may be used on the sense electrode and the drive electrode sides of the MEMS resonator arm. FIG. 4L shows mixing and matching various electrode profiles on sides of the MEMS resonator arm and the corresponding surfaces of the sense and drive electrodes. Finally, the electrode profiles shown in FIGS. 4M and 4N result in a positive capacitance along one portion of the MEMS resonator arm and negative capacitance along another portion of the MEMS resonator arm.

Figure 5:
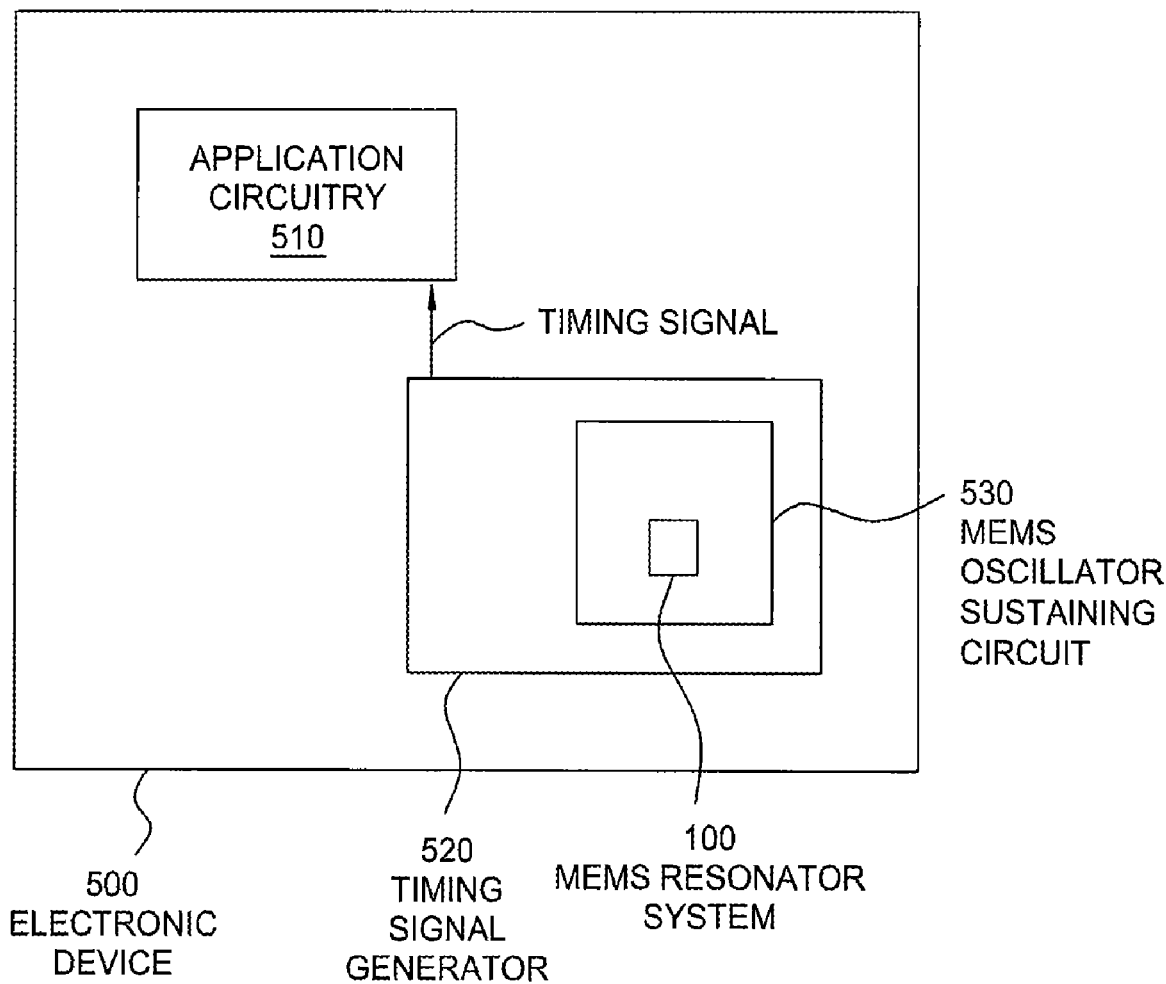
FIG. 5 is a conceptual diagram of an electronic device configured to implement one or more aspects of the present invention.
Figure 6A:
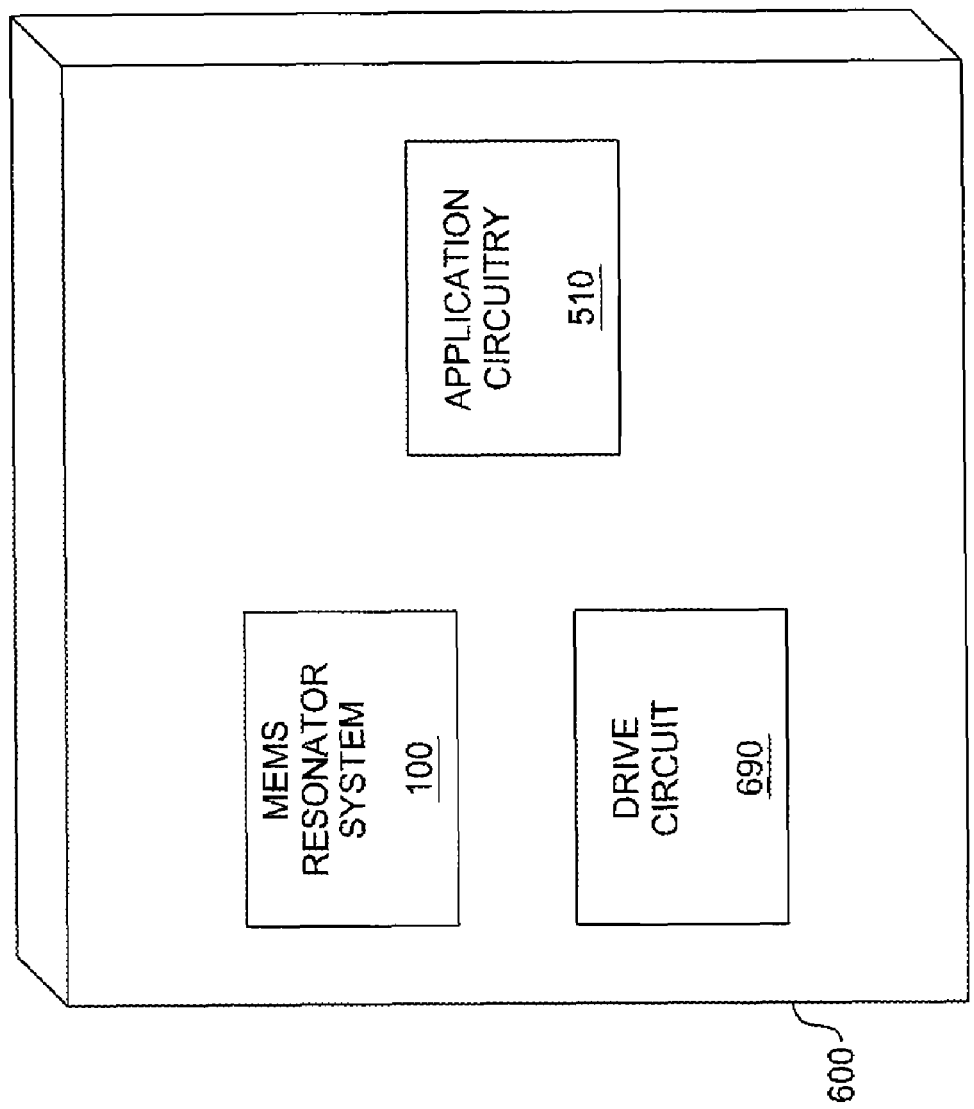
Figure 6B:
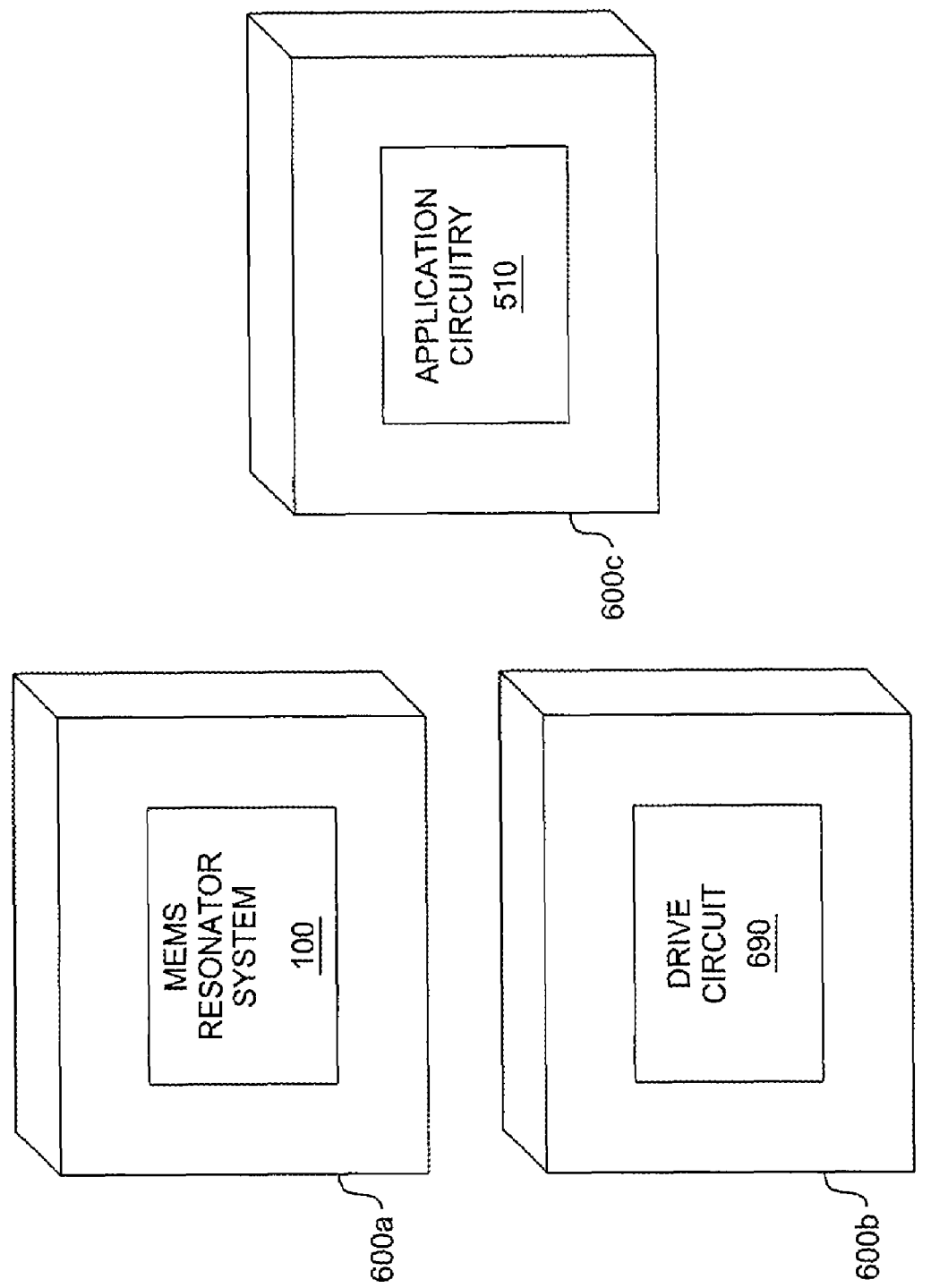
Figure 6C:
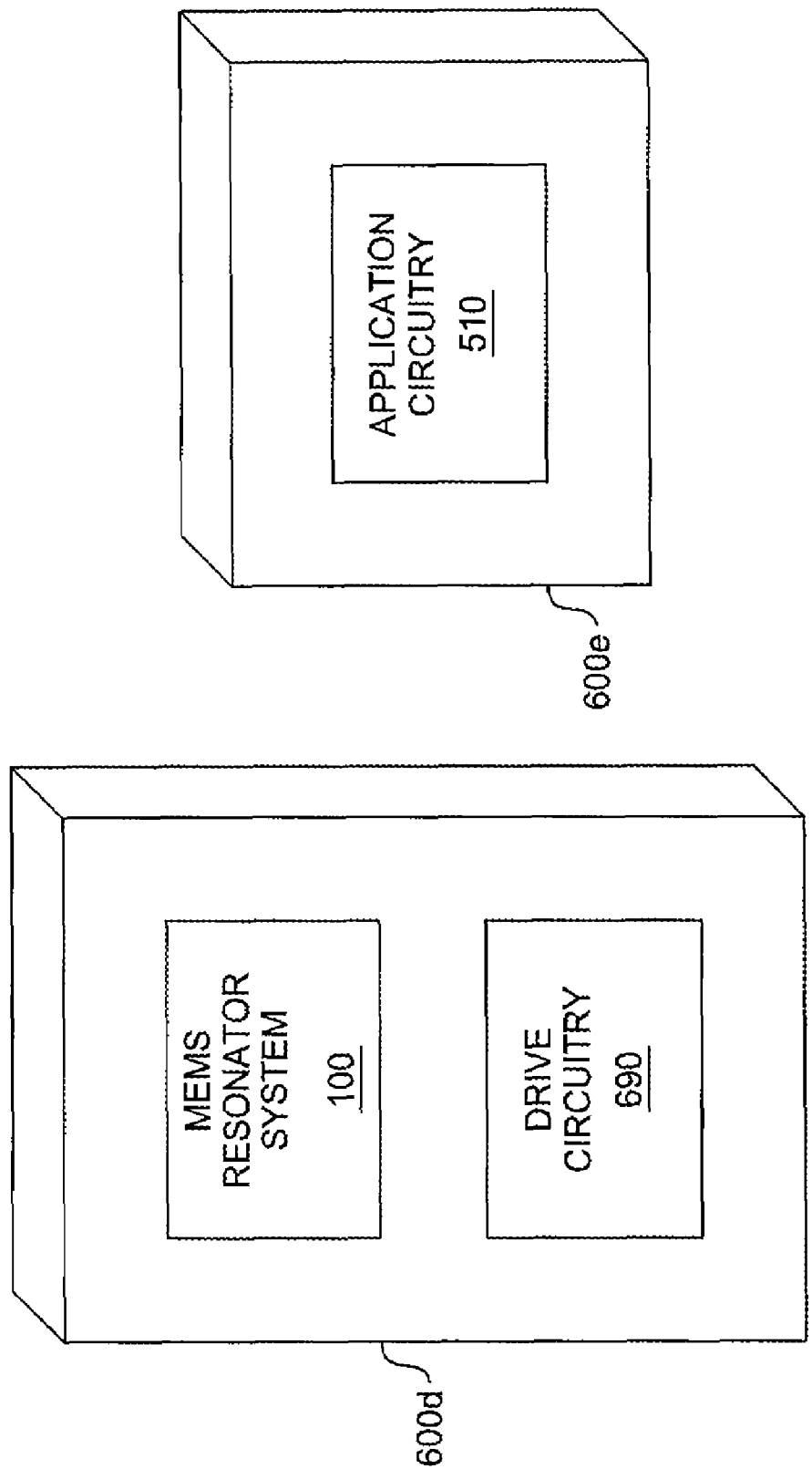
Figure 6D:
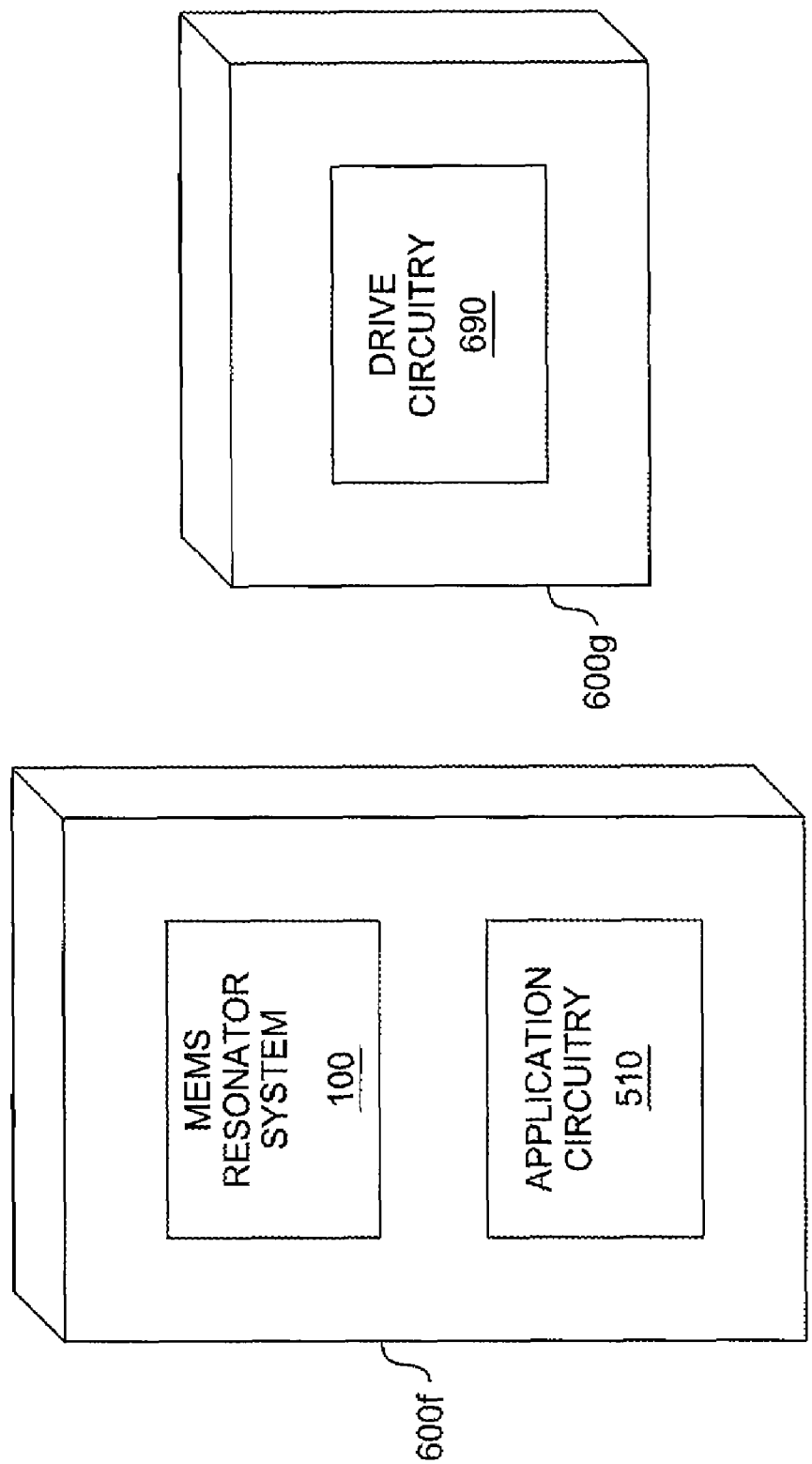

FIG. 5 is a conceptual diagram of an electronic device 500 configured to implement one or more aspects of the present invention. As shown, electronic device 500 includes, without limitation, a timing signal generator 520 configured to provide a timing signal to application circuitry 510. The timing signal generator 520 includes a MEMS oscillator sustaining circuit 530. In one embodiment, the MEMS oscillator sustaining circuit 530 includes the MEMS resonator system 100, where the serrated electrodes of the MEMS resonator arm and the electrodes are configured as shown in FIG. 2. Alternatively, the MEMS oscillator sustaining circuit 530 may include the MEMS resonator system 100, where the teeth of the MEMS resonator arm and the electrodes are configured as shown in FIG. 3 or in FIGS. 4A through 4N. Furthermore, the MEMS oscillator sustaining circuit 530 includes a drive circuit (not shown) that drives the MEMS resonator system 100. Electronic device 500 may be any type of electronic device that includes application circuitry requiring a timing signal. Some examples of electronic device 500 include, without limitation, an electronic wrist watch, a personal digital assistant, or a cellular phone.

Using FIG. 1 as an example, in alternate embodiments, the MEMS resonator system 100 may be disposed on/in the same substrate or on/in different substrates than the drive circuit. Moreover, the application circuitry 510 may be disposed on/in the same substrates as the MEMS resonator system 100 and/or the drive circuit. FIGS. 6A through 6E illustrate some of the ways to position the MEMS resonator system 100, a drive circuit 690, and the application circuitry 510 on one or more substrates. In particular, the MEMS resonator system 100 and/or the drive circuit 690 and/or the application circuitry 510 may be integrated on/in the same substrate 600, as shown on FIG. 6A, on/in different substrates 600a, 600b and 600c, as shown on FIG. 6B, or on/in different substrates 600d, 600e, 600f, 600g, 600h and 600i, as shown on FIGS. 6C, 6D, and 6E. All permutations and combinations thereof are intended to fall within the scope of the present invention.

While the foregoing is directed to embodiments of the present invention, other and further embodiments of the present invention may be devised without departing from the basic scope thereof, and the scope thereof is determined by the claims that follow.

We claim:

1. A microelectromechanical system (MEMS) for generating a timing signal, the system comprising:
a MEMS resonator including a first member aligned substantially parallel to a first axis when stationary and having a serrated surface comprised of a first plurality of teeth; and
a first drive electrode aligned substantially parallel to the first axis and having a serrated surface comprised of a second plurality of teeth that opposes the serrated surface of the first member, wherein the teeth in the first plurality are interleaved with the teeth in the second plurality, wherein the first member is configured to rotate towards the first drive electrode about a second axis that is perpendicular to the first axis when a signal is applied to the first drive electrode,
wherein the teeth in the first plurality of teeth and the teeth in the second plurality of teeth have no surfaces substantially parallel to a third axis that is perpendicular to both the first axis and the second axis, and
wherein a capacitive change across each surface of a tooth in the first plurality of teeth and a corresponding surface of an opposing tooth in the second plurality of teeth results when the first member rotates towards the first drive electrode.

2. The system of claim 1, wherein each tooth in the first plurality of teeth is separated from at least one opposing tooth in the second plurality of teeth by a gap when the first member is stationary.

3. The system of claim 2, wherein the gap between each tooth in the first plurality of teeth and the at least one opposing tooth in the second plurality of teeth is substantially the same for each tooth in the first plurality of teeth.

4. The system of claim 3, wherein the gap is approximately 400 nanometers.

5. The system of claim 4, wherein the first member is approximately 200 microns in length.

6. The system of claim 5, wherein the gaps between the teeth in the first plurality of teeth located proximately to one end of the first member and the opposing teeth in the second plurality of teeth decrease to approximately 200 nanometers when the first member rotates towards the first drive electrode.

7. The system of claim 1, wherein the MEMS resonator is fixed to an underlying substrate by only one anchor.

8. The system of claim 1, wherein the MEMS resonator further includes a second member having a serrated surface comprised of a third plurality of teeth, and further comprising:
a second drive electrode having a serrated surface comprised of a fourth plurality of teeth that opposes the serrated surface of the second member, wherein the teeth in the third plurality are interleaved with the teeth in the fourth plurality when the second member is stationary, and
wherein the second member is configured to rotate towards the second drive electrode when the signal is applied to the second drive electrode.

9. The system of claim 8, wherein the rotation of the first member towards the first drive electrode is substantially equal and opposite to the rotation of the second member towards the second drive electrode.

10. The system of claim 1, wherein the first plurality of teeth and the second plurality of teeth are configured such that the capacitance between a first portion of the first member and the first drive electrode is positive and the capacitance between a second portion of the first member and the first drive electrode is negative when the first member rotates towards the first drive electrode.

11. The system of claim 1, wherein the serrated teeth in the first plurality and the serrated teeth in the second plurality have a rounded configuration.

12. An electronic device, comprising:
application circuitry; and
a microelectromechanical system (MEMS) for generating a timing signal for the application circuitry, the system comprising:
a MEMS resonator including a first member aligned substantially parallel to a first axis when stationary and having a serrated surface comprised of a first plurality of teeth; and
a first drive electrode aligned substantially parallel to the first axis and having a serrated surface comprised of a second plurality of teeth that opposes the serrated surface of the first member, wherein the teeth in the first plurality are interleaved with the teeth in the second plurality, wherein the first member is configured to rotate towards the first drive electrode about a second axis that is perpendicular to the first axis when a signal is applied to the first drive electrode, wherein the teeth in the first plurality of teeth and the teeth in the second plurality of teeth have no surfaces substantially parallel to a third axis that is perpendicular to both the first axis and the second axis, and wherein a capacitive change across each surface of a tooth in the first plurality of teeth and a corresponding surface of an opposing tooth in the second plurality of teeth results when the first member rotates towards the first drive electrode.

13. The electronic device of claim 12, wherein each tooth in the first plurality of teeth is separated from at least one opposing tooth in the second plurality of teeth by a gap when the first member is stationary.

14. The electronic device of claim 13, wherein the gap between each tooth in the first plurality of teeth and the at least one opposing tooth in the second plurality of teeth is substantially the same for each tooth in the first plurality of teeth.

15. The electronic device of claim 14, wherein the gap is approximately 400 nanometers.

16. The electronic device of claim 15, wherein the first member is approximately 200 microns in length.

17. The electronic device of claim 16, wherein the gaps between the teeth in the first plurality of teeth located proximately to one end of the first member and the opposing teeth in the second plurality of teeth decrease to approximately 200 nanometers when the first member rotates towards the first drive electrode.

18. The electronic device of claim 12, wherein the MEMS resonator is fixed to an underlying substrate by only one anchor.

19. The electronic device of claim 12, wherein the MEMS resonator further includes a second member having a serrated surface comprised of a third plurality of teeth, and further comprising:

a second drive electrode having a serrated surface comprised of a fourth plurality of teeth that opposes the serrated surface of the second member, wherein the teeth in the third plurality are interleaved with the teeth in the fourth plurality when the second member is stationary, and wherein the second member is configured to rotate towards the second drive electrode when the signal is applied to the second drive electrode.

20. The electronic device of claim 19, wherein the rotation of the first member towards the first drive electrode is substantially equal and opposite to the rotation of the second member towards the second drive electrode.

21. The electronic device of claim 12, wherein the first plurality of teeth and the second plurality of teeth are configured such that the capacitance between a first portion of the first member and the first drive electrode is positive and the capacitance between a second portion of the first member and the first drive electrode is negative when the first member rotates towards the first drive electrode.

22. The electronic device of claim 12, wherein the serrated teeth in the first plurality and the serrated teeth in the second plurality have a rounded configuration.

* * * * *